(12) United States Patent
Fujimori

(10) Patent No.: US 8,298,731 B2
(45) Date of Patent: Oct. 30, 2012

(54) DYE-CONTAINING NEGATIVE CURABLE COMPOSITION, COLOR FILTER AND METHOD OF PRODUCING COLOR FILTER

(75) Inventor: Toru Fujimori, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 199 days.

(21) Appl. No.: 12/318,740

(22) Filed: Jan. 7, 2009

(65) Prior Publication Data

US 2009/0197066 A1  Aug. 6, 2009

(30) Foreign Application Priority Data

Jan. 31, 2008  (JP) ................................ 2008-021252

(51) Int. Cl.
*G02B 5/20* (2006.01)
*G03F 7/00* (2006.01)

(52) U.S. Cl. ......................................... 430/7; 430/270.1

(58) Field of Classification Search .................. None
See application file for complete search history.

(56) References Cited

U.S. PATENT DOCUMENTS

2007/0049650 A1\* 3/2007 Araki ................ 522/6
2007/0072096 A1   3/2007 Takakuwa et al.
2007/0212623 A1   9/2007 Takakuwa et al.
2008/0010756 A1\* 1/2008 Hall-Goulle et al. .......... 8/637.1

FOREIGN PATENT DOCUMENTS

| EP | 1850178 A | 10/2007 |
| JP | A 2-181704 | 7/1990 |
| JP | A 6-75375 | 3/1994 |
| JP | 2004-102112 A | 4/2004 |
| JP | 2004109423 | 4/2004 |
| WO | 2006/024617 A1 | 3/2006 |

OTHER PUBLICATIONS

The extended European search report dated Jun. 10, 2009.
Japanese Office Action dated Feb. 28, 2012 issued in the corresponding Japanese Application.
European Office Action dated Jun. 13, 2012 issued in the corresponding European Patent Application.

\* cited by examiner

*Primary Examiner* — John A. McPherson
(74) *Attorney, Agent, or Firm* — SOLARIS Intellectual Property Group, PLLC

(57) ABSTRACT

The present invention provides a dye-containing negative curable composition including a dye that is soluble in an organic solvent, a photopolymerization initiator, a photopolymerizable compound, and cyclopentanone; a color filter formed from the dye-containing negative curable composition; and a method of producing the color filter.

4 Claims, No Drawings

DYE-CONTAINING NEGATIVE CURABLE COMPOSITION, COLOR FILTER AND METHOD OF PRODUCING COLOR FILTER

CROSS-REFERENCE TO RELATED APPLICATION

This application claims priority under 35 USC 119 from Japanese Patent Application No. 2008-021252, the disclosure of which is incorporated by reference herein.

BACKGROUND OF THE INVENTION

1. Field of the Invention

The present invention relates to a dye-containing negative curable composition, a color filter using the dye-containing negative curable composition, and a method of producing the color filter. More specifically, the present invention relates to a dye-containing negative curable composition which structures a color filter used in liquid crystal displays (LCD) and solid-state image sensors (CCD, CMOS and the like) and is preferable in the formation of printed images.

2. Description of Related Art

Known methods of producing a color filter used in liquid crystal displays and solid-state image sensors include a dye method, a print method, an electrodeposition method, and a pigment-dispersion method.

Among these, the pigment-dispersion method is a method of producing a color filter by a photolithographic method using a colored radiosensitive composition including a pigment dispersed in a radiosensitive composition of various kinds. This method has the advantage of stability in light, heat or the like, due to the use of a pigment. Further, since patterning is conducted by the photolithographic method, this method is considered to be suitable for producing a color filter for a large-sized color display having high positional accuracy and high resolution.

In the pigment-dispersion method of producing a color filter, a color filter is obtained by repeating a process for each color, the process including forming a coating film by applying and drying a radiosensitive composition onto a glass substrate by a spin-coater or a roll-coater, forming a colored pixel by exposing the coating film to light in a pattern-wise manner, and developing the exposed coating film.

For example, Japanese Patent Application Laid-Open (JP-A) No. 2-181704 discloses a pigment-dispersion method using a negative photosensitive composition including an alkali-soluble resin, a photopolymerizable monomer and a photopolymerization initiator.

On the other hand, in recent years, even higher resolution in color filters used in solid-state image sensors has been desired. However, it is difficult to achieve further improvements in resolution in a conventional pigment-dispersion system, since there are problems such as occurrence of color irregularities caused by coarse particles in the pigment. Therefore, the pigment-dispersion system is not suitable for applications in which a fine-sized pattern is required, such as solid-state image sensors.

In view of the above-mentioned problems, a technique of using a dye instead of a pigment has been proposed (for example, see JP-A No. 6-75375).

There has been a demand for color filters used in solid-state image sensors in recent years to have a film thickness of 1 μm or less. In order to achieve such a small thickness, the concentration of a dye needs to be increased. Since some dyes exhibit low solubility in an organic solvent due to their structure, there have been cases in which difficulty in preparing a resist solution is caused by insufficient solubility of the dye when conventional solvents (such as ethyl lactate or propylene glycol monomethyl ether acetate) are used.

Further, a technique of using cyclohexanone, which has a relatively high ability of dissolving a dye compared with other organic solvents, is known. However, when cyclohexanone is used, coating uniformity may deteriorate in some cases.

The present invention has been made in view of the above circumstances, and provides a dye-containing negative curable composition that exhibits excellent coating uniformity, a color filter with colored pixels having a uniform film thickness, and a method of producing the color filter.

SUMMARY OF THE INVENTION

An aspect of the present invention provides a dye-containing negative curable composition comprising a dye that is soluble in an organic solvent, a photopolymerization initiator, a photopolymerizable compound, and cyclopentanone.

DETAILED DESCRIPTION OF THE INVENTION

In the following, details of the dye-containing negative curable composition, the color filter using the dye-containing negative curable composition, and the method of producing the same according to the present invention will be described.

Dye-containing Negative Curable Composition

The dye-containing negative curable composition of the present invention includes at least a dye that is soluble in an organic solvent, a photopolymerization initiator, a photopolymerizable compound, and cyclopentanone.

By using the above composition, coating uniformity, namely, uniformity in thickness of a coating film formed from the composition can be improved.

The dye-containing negative curable composition of the present invention may also include other components such as an alkali-soluble binder and a crosslinking agent.

(A) Dye Soluble in Organic Solvent

The dye that is soluble in an organic solvent is not particularly limited, but may be selected from known dyes that are used in conventional color filters. Examples of these known dyes include dyes described in JP-A Nos. 64-90403, 64-91102, 1-94301 and 6-11614, JP No. 2592207, U.S. Pat. Nos. 4,808,501, 5,667,920 and 5,059,500, and JP-A Nos. 5-333207, 6-35183, 6-51115 and 6-194828. Examples of the chemical structure of the dyes that are soluble in an organic solvent include triphenylmethane series, anthraquinone series, benzylidene series, oxonol series, cyanine series, phenothiazine series, pyrazole azo series, anilino azo series, pyrazolotriazole azo series, pyridone azo series, pyrrolopyrazole azomethine series, xanthene series, phthalocyanine series, benzopyrane series, indigo series, and anthrapyridone series. Among these, pyrazole azo series, anilino azo series, pyrazolotriazole azo series, pyridone azo series, anthraquinone series, and anthrapyridone series are particularly preferable.

Further, in the case of a resist system that can be patterned by water or alkaline development, acidic dyes and/or derivatives thereof may favorably be used as dyes that are soluble in an organic solvent in view of complete removal of a binder and/or a dye by development. In addition, direct dyes, basic dyes, mordant dyes, acid mordant dyes, azoic dyes, dispersive dyes, oil soluble dyes, foodstuff dyes and/or derivatives thereof may favorably be used as dyes that are soluble in an organic solvent in the present invention.

Acidic Dye

The acidic dyes are not particularly limited as long as they have an acidic group such as a sulfonic group, a carboxyl group or a phenolic hydroxyl group, and may be selected in consideration of necessary properties such as solubility in an organic solvent or a developer, salt formation with a basic compound, light absorbance, interaction with other components in the curable composition, light resistance and heat resistance.

In the following, specific examples of the above acidic dyes are described. However, the present invention is not limited thereto.

Acid Alizarin Violet N;

Acid Black 1, 2, 24 and 48;

Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335 and 340;

Acid Chrome Violet K;

Acid Fuchsin;

Acid Green 1, 3, 5, 9, 16, 25, 27, 50, 58, 63, 65, 80, 104, 105, 106 and 109;

Acid Orange 6, 7, 8, 10, 12, 26, 50, 51, 52, 56, 62, 63, 64, 74, 75, 94, 95, 107, 108, 169 and 173;

Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422 and 426;

Acid Violet 6B, 7, 9, 17 and 19;

Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243 and 251;

Direct Yellow 2, 33, 34, 35, 38, 39, 43, 47, 50, 54, 58, 68, 69, 70, 71, 86, 93, 94, 95, 98, 102, 108, 109, 129, 136, 138 and 141;

Direct Orange 34, 39, 41, 46, 50, 52, 56, 57, 61, 64, 65, 68, 70, 96, 97, 106 and 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246 and 250;

Direct Violet 47, 52, 54, 59, 60, 65, 66, 79, 80, 81, 82, 84, 89, 90, 93, 95, 96, 103 and 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275 and 293;

Direct Green 25, 27, 31, 32, 34, 37, 63, 65, 66, 67, 68, 69, 72, 77, 79 and 82;

Mordant Yellow 5, 8, 10, 16, 20, 26, 30, 31, 33, 42, 43, 45, 56, 50, 61, 62 and 65;

Mordant Orange 3, 4, 5, 8, 12, 13, 14, 20, 21, 23, 24, 28, 29, 32, 34, 35, 36, 37, 42, 43, 47 and 48;

Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94 and 95;

Mordant Violet 2, 4, 5, 7, 14, 22, 24, 30, 31, 32, 37, 40, 41, 44, 45, 47, 48, 53 and 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83 and 84;

Mordant Green 1, 3, 4, 5, 10, 15, 19, 26, 29, 33, 34, 35, 41, 43 and 53;

Food Yellow 3;

Valifast Yellow 1101, 1109, 1151, 3108, 3120, 3130, 3150, 3170 and 4120; and derivatives of these dyes.

Among the above acidic dyes,

Acid Black 24;

Acid Blue 23, 25, 29, 62, 80, 86, 87, 92, 138, 158, 182, 243 and 324:1;

Acid Orange 8, 51, 56, 63 and 74;

Acid Red 1, 4, 8, 34, 37, 42, 52, 57, 80, 97, 114, 143, 145, 151, 183, 217 and 249;

Acid Violet 7;

Acid Yellow 17, 25, 29, 34, 42, 72, 76, 99, 111, 112, 114, 116, 134, 155, 169, 172, 184, 220, 228, 230, 232 and 243;

Acid Green 25;

Valifast Yellow 1101, 1109, 1151 and 3120; and derivatives of these dyes are preferable.

Further, other than the above, azo series, xanthene series and phthalocyanine series acidic dyes are also preferable, and C.I. Solvent Blue 44 and 38; C.I. Solvent Orange 45; Rhodamine B; Rhodamine 110; 2,7-naphthalenedisulfonic acid; 3-[(5-chloro-2-phenoxyphenyl)hydrazono]-3,4-dihydro-4-oxo-5-[(phenylsulfonyl)amino]-2,7-naphthalenedisulfonic acid, or the like and derivatives of these acidic dyes may favorably be used.

The derivatives of acidic dyes include inorganic salts of acidic dyes having an acidic group such as a sulfonic group, carboxyl group or the like, salts of the acidic dye and a nitrogen-containing compound, sulfonamide derivatives of the acidic dyes, or the like. The derivatives are not particularly limited as long as they can be dissolved in a curable composition when it is prepared in the form of a solution, and may be selected in consideration of necessary properties such as solubility in an organic solvent or a developer, light absorbance, interaction with other components in the curable composition, light resistance and heat resistance.

Methods of forming the above-mentioned salts of an acidic dye and a nitrogen-containing compound may be effective in improving the solubility of an acidic dye (imparting solubility to an organic solvent) or in improving heat resistance and light resistance.

A nitrogen-containing compound that forms a salt with an acidic dye and a nitrogen-containing compound that forms an amide bond with an acidic dye are selected in consideration of the properties of the salt or amide compound such as the solubility in an organic solvent or a developer, salt formation, light absorbance and chromatic valence of the dye, interaction with other components in the curable composition, light resistance and heat resistance as a colorant, and the like. When selected only in view of light absorbance and chromatic valence, it is preferable that the molecular weight of the nitrogen-containing compound is as low as possible, more preferably 300 or less, yet more preferably 280 or less, and particularly preferably 250 or less.

The molar ratio (referred to as "n" in the following) of the nitrogen-containing compound and the acidic dye (nitrogen-containing compound/acidic dye) in the salt of an acidic dye and a nitrogen-containing compound is explained. n is a value determined by the molar ratio of the acidic dye molecule and the amine compound as a counter ion, and may be freely selected in accordance with the conditions for acidic dye-amine compound salt formation. Specifically, a numerical value of $0 < n \leq 5$ is commonly used with respect to the number of acidic functional groups in the acidic dye in practical applications, and is selected after consideration of necessary properties such as solubility in an organic solvent or a developer, salt formation, light absorbance, interaction with other components in the curable composition, light resistance and heat resistance. When selected only in view of light absorbance, n is preferably a numerical value satisfying $0<n\leq4.5$, more preferably a numerical value satisfying $0<n\leq4$ and particularly preferably a numerical value satisfying $0<n\leq3.5$.

Since the above acidic dyes are constituted as acidic dyes by the introduction of an acidic group into their structure, they may be made into non-acidic dyes by changing the substituent.

While there are cases where acidic dyes act favorably in alkaline development, there are also cases where over-development occurs, and thus non-acidic dyes may be favorably used.

The content of the dye that is soluble in an organic solvent in the negative curable composition containing differs according to the dye, but may be selected from the range of 10-80 mass %, preferably 20-70 mass %, more preferably 40-70 mass %, with respect to the total solid content in the composition.

The dye that is soluble in an organic solvent may be used alone or in combination of two or more.

For example, when the dyes compose complementary colors of yellow, magenta and cyan, dyes of the respective single colors may be used for each color. On the other hand, when the dyes compose primary colors of red, green and blue, a combination of two or more dyes is preferably used for each color in view of the hue, namely, it is preferable to make up each primary color system by combining two or more dyes.

Photopolymerizable Compound

The dye-containing negative curable composition of the present invention includes at least one polymerizable compound. The photopolymerizable compound is preferably a radical-polymerizable monomer.

(Radical-Polymerizable Monomer)

The radical-polymerizable monomer preferably has at least one ethylenic unsaturated double bond having an ability of addition polymerization and a boiling point of 100° C. or less under ordinary pressure. By including the photopolymerizable compound together with the later-described photopolymerization initiator, a negative-type curable composition can be prepared.

Examples of the radical-polymerizable monomer include: monofunctional acrylates and methacrylates (hereinafter, referred to as (meth)acrylates) such as polyethylene glycol mono(meth)acrylate, polypropylene glycol mono(meth)acrylate and phenoxyethyl(meth)acrylate; polyethylene glycol di(meth)acrylate, trimethylol ethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylol propane tri(acryloyloxypropyl)ether, tri(acryloyloxyethyl)isocyanurate; compounds that have been (meth)acrylated after addition of ethylene oxide or propylene oxide to polyfunctional alcohol such as glycerin or trimethylolethane; urethane acrylates such as those described in Japanese Patent Publication (JP-B) Nos. 48-41708 and 50-6034 and JP-A No. 51-37193; polyester acrylates described in JP-A No. 48-64183 and JP-B Nos. 49-43191 and 52-30490; and polyfunctional acrylates and methacrylates, and mixtures thereof, such as epoxy acrylates that are the product of a reaction between an epoxy resin and (meth)acrylic acid. Further examples include the substances presented as photocurable monomers and oligomers in the *Journal of the Adhesion Society of Japan*, Vol. 20, No. 7, pp. 300-308.

The content of the radical-polymerizable monomer with respect to the total solid content (mass) of the dye-containing negative curable composition is preferably 0.1 to 90 mass %, more preferably 1.0 to 80 mass %, and particularly preferably 2.0 to 70 mass %.

Photopolymerization Initiator

The dye-containing negative curable composition of the present invention includes at least one kind of photopolymerization initiator, together with the above-mentioned photopolymerizable compound (for example, a radical-polymerizable monomer). The photopolymerization initiator is not particularly limited as long as it can polymerize the photopolymerizable compound, but is preferably selected in view of its properties, initiation efficiency, absorption wavelength, availability, cost and the like.

Examples of the photopolymerization initiator include at least one active halide selected from halomethyloxadiazole compounds and halomethyl-s-triazine compounds, 3-aryl substituted coumarin compounds, lophine dimers, benzophenone compounds, acetophenone compounds and derivatives thereof, cyclopentadiene-benzene-iron complexes and salts thereof, and oxime compounds.

Examples of the halomethyloxadiazole compound include 2-halomethyl-5-vinyl-1,3,4-oxadiazole compounds and the like as described in JP-B No. 57-6096, 2-trichloromethyl-5-styryl-1,3,4-oxadiazole, 2-trichloromethyl-5-(p-cyanostryryl)-1,3,4-oxadiazole and 2-trichloromethyl-5-(p-methoxystyryl)-1,3,4-oxadiazole.

Examples of the halomethyl-s-triazine compound include vinyl-halomethyl-s-triazine compounds as described in JP-B No. 59-1281, 2-(naphth-1-yl)-4,6-bis(halomethyl)-s-triazine compounds as described in JP-A No. 53-133428 and 4-(p-aminophenyl)-2,6-bis(halomethyl)-s-triazine compounds.

Specific examples of the halomethyl-s-triazine compounds include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphth-1-yl)-4,6-bis(trichloromethyl)-s-triazine, 2-(4-methoxy-naphth-1-yl)-4,6-bis(trichloromethyl)-s-triazine, 2-(4-ethoxy-naphth-1-yl)-4,6-bis(trichloromethyl)-s-triazine, 2-(4-butoxy-naphth-1-yl)-4,6-bis(trichloromethyl)-s-triazine, 2-[4-(2-methoxyethyl)-naphth-1-yl]-4,6-bis(trichloromethyl)-s-triazine, 2-[4-(2-ethoxyethyl)-naphth-1-yl]-4,6-bis(trichloromethyl)-s-triazine, 2-[4-(2-butoxyethyl)-naphth-1-yl]-4,6-bis(trichloromethyl)-s-triazine, 2-(2-methoxy-naphth-1-yl)-4,6-bis(trichloromethyl)-s-triazine, 2-(6-methoxy-5-methyl-naphth-2-yl)-4,6-bis(trichloromethyl)-s-triazine, 2-(6-methoxy-naphth-2-yl)-4,6-bis(trichloromethyl)-s-triazine, 2-(5-methoxy-naphth-1-yl)-4,6-bis(trichloromethyl)-s-triazine, 2-(4,7-dimethoxy-naphth-1-yl)-4,6-bis(trichloromethyl)-s-triazine, 2-(6-ethoxy-naphth-2-yl)-4,6-bis(trichloromethyl)-s-triazine, 2-(4,5-dimethoxy-naphth-1-yl)-4,6-bis(trichloromethyl)-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N- ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)animophenyl]-2,6-di(trichloromethyl)-s-triazine, 4-[m-bromo-p-N,N-di(ethoxycarbonylmethyl)animophenyl]-2,6-di(trichloromethyl)-s-triazine, 4-[m-chloro-p-N,N-di(ethoxycarbonylmethyl)animophenyl]-2,6-di(trichloromethyl)-s-triazine, 4-[m-fluoro-p-N,N-di(ethoxycarbonylmethyl)animophenyl]-2,6-di(trichloromethyl)-s-triazine, 4-[o-bromo-p-N,N-di(ethoxycarbonylmethyl)animophenyl]-2,6-di(trichloromethyl)-s-triazine, 4-[o-chloro-p-N,N-di(ethoxycarbonylmethyl)animophenyl]-2,6-di(trichloromethyl)-s-triazine, 4-[o-fluoro-p-N,N-di(ethoxycarbonylmethyl)animophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylanimophenyl)-2,6-di(trichloromethyl)-s-triazine, 4-(m-chloro-p-N-ethoxycarbonylmethylanimophenyl)-2,6-di(trichloromethyl)-s-triazine, 4-(m-fluoro-p-N-ethoxycarbonylmethylanimophenyl)-2,6-di(trichloromethyl)-s-triazine, 4-(o-bromo-p-N-ethoxycarbonylmethylanimophenyl)-2,6-di(trichloromethyl)-s-triazine, 4-(o-chloro-p-N-ethoxycarbonylmethylanimophenyl)-2,6-di(trichloromethyl)-s-triazine, 4-(o-fluoro-p-N-ethoxycarbonylmethylanimophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

Other examples of the photopolymerization initiator include the TAZ series produced by Midori Kagaku Co., Ltd. (for example, TAZ-107, TAZ-110, TAZ-104, TAZ-109, TAZ-140, TAZ-204 TAZ-113 and TAZ-123), the T series produced by Panchim Ltd. (for example, T-OMS, T-BMP, T-R and T-B), the IRGACURE® series (for example, IRGACURE 651, IRGACURE 184, IRGACURE 500, IRGACURE 1000, IRGACURE 149, IRGACURE 819 and IRGACURE 261) and DALOCURE® series (for example, DALOCURE 1173) produced by Ciba Specialty Chemicals, 4,4'-bis(diethylamino)-benzophenone, 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimers, and benzoin isopropyl ether.

Among these photopolymerization initiators, oxime compounds are preferable and, for example, 2-(O-benzoyloxime)-1-[4-(phenylthio)phenyl]-1,2-octanedione (a product from Ciba Japan, K.K.), and 1-(O-acetyloxime)-1-[9-ethyl-6-(2-methylbenzoyl)-9H-carbazol-3-yl]ethanone (a product from Ciba Japan, K.K.) are particularly preferable.

Further, a sensitizer and/or a light stabilizer may be used together with these photopolymerization initiators.

Specific examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzylacetone, p-(dimethylamino)phenylstyrylketone, p-(dimethylamino)phenyl-p-methylstyrylketone, benzophenone, p-(dimethylamino)benzophenone (or Michler's ketone), p-(diethylamino)benzophenone, benzoanthrone, benzothiazole compounds as disclosed in JP-B No. 51-48516, and TINUVIN 1130 and 400.

In addition to the above photopolymerization initiators, other known photopolymerization initiators may be used in the dye-containing negative curable composition of the present invention.

Specific examples of these known photopolymerization initiators include vicinal polyketol aldonil compounds disclosed in U.S. Pat. No. 2,367,660, α-carbonyl compounds disclosed in U.S. Pat. Nos. 2,367,661 and 2,367,670, acyloin ethers disclosed in U.S. Pat. No. 2,448,828, α-hydrocarbon-substituted aromatic acyloin compounds disclosed in U.S. Pat. No. 2,722,512, polynuclear quinone compounds disclosed in U.S. Pat. Nos. 3,046,127 and 2,951,758, combinations of triallyl imidazole dimer with p-aminophenyl ketone disclosed in U.S. Pat. No. 3,549,367 and combinations of benzothiazole compounds with trihalomethyl-s-triazine compounds disclosed in JP-B No. 51-48516.

The content amount of the photopolymerization initiator (and other polymerizable compounds in some cases) with respect to the total solid content (mass) of the photopolymerizable compound is preferably from 0.01 mass % to 50 mass %, more preferably from 1 mass % to 30 mass %, and particularly preferably from 1 mass % to 20 mass %. When the content amount of the photopolymerization initiator is 0.01 mass % or more, polymerization and curing can favorably proceed, and when 50 mass % or less, film strength can be improved.

Alkali-Soluble Binder

The dye-containing negative curable compound of the present invention may include an alkali-soluble binder. The alkali-soluble binders is not particularly limited as long as it is water-soluble or alkali-soluble, and may be preferably selected in view of heat resistance, developability, availability and the like.

Preferable alkali-soluble binders include a linear organic high-molecular polymer that is soluble in an organic solvent and that can be used in development in a weak alkali aqueous solution. Examples of the linear organic high-molecular polymer include polymers having a carboxyl group in a side chain, such as the methacrylic acid copolymers, acrylic acid copolymers, itaconic acid copolymers, crotonic acid copolymers, maleic acid copolymers, partially-esterified maleic acid copolymers and the like described in, for example, JP-A Nos. 59-44615, 59-53836 and 59-71048 and JP-B Nos. 54-34327, 58-12577 and 54-25957 and, similarly, acidic cellulose derivatives having a carboxyl group in a side chain may be used effectively.

Further, polymers having a hydroxyl group to which an acid anhydride has been added, polyhydroxystyrene resins, polysiloxane resins, poly(2-hydroxyethyl(meth)acrylate), polyvinyl pyrrolidone, polyethylene oxide, polyvinyl alcohol or the like may be used effectively as the binder for the present invention.

The linear organic high-molecular polymer may be formed by copolymerization using a monomer having hydrophilicity, examples of which include alkoxyalkyl(meth)acrylate, hydroxyalkyl(meth)acrylate, glycerol(meth)acrylate, (meth) acrylamide, N-methylol acrylamide, secondary or tertiary alkyl acrylamide, dialkyl aminoalkyl(meth)acrylate, morpholine(meth)acrylate, N-vinyl pyrrolidone, N-vinyl caprolactam, vinyl imidazole, vinyl triazole, methyl(meth)acrylate, ethyl(meth)acrylate, branched or straight-chain propyl (meth)acrylate, branched or straight-chain butyl(meth) acrylate, and phenoxy hydroxypropyl(meth)acrylate.

In addition, monomers that include a tetrahydrofurfuryl group, a phosphoric acid group, a phosphoric acid ester group, a quaternary ammonium salt group, an ethyleneoxy chain, a propyleneoxy chain, a sulfonic acid group and a group derived from a salt of a sulfonic acid group, a morpholinoethyl group, and the like may be effectively used as the monomer having hydrophilicity.

The alkali-soluble binder used in the present invention may have a polymerizable group in a side chain in order to improve cross-linking efficiency and, for example, polymers containing an allyl group, a (meth)acryloyl group, an allyloxyalkyl group or the like in a side chain may be effectively used. Examples of the polymers containing a polymerizable group include the commercial products KS Resist 106 (manufactured by Osaka Organic Chemical Industry Ltd.) and the Cyclomer-P series (manufactured by Daicel Chemical Industries, Ltd.). Further, an alcohol-soluble nylon, a polyether formed from 2,2-bis-(4-hydroxyphenyl)-propane and epichlorohydrin, or the like may be effectively used in order to increase the strength of the cured film.

Among these alkali-soluble binders, polyhydroxystyrene resins, polysiloxane resins, acrylic resins, acrylamide resins, and acrylic/acrylamide copolymer resins are preferable in view of heat resistance, and acrylic resins, acrylamide resins, and acrylic/acrylamide copolymer resins are preferable in view of developability control.

Copolymers formed from monomers selected from, for example, benzyl(meth)acrylate, (meth)acrylic acid, hydroxyethyl(meth)acrylate and (meth)acrylamide, or the commercial products KS Resist 106 (manufactured by Osaka Organic Chemical Industry Ltd.), the Cyclomer-P series (manufactured by Daicel Chemical Industries, Ltd.) or the like are preferable as the above acrylic resins.

In view of developability, liquid viscosity and the like, a polymer having a weight-average molecular weight (being a polystyrene equivalent value measured by the GPC method) of from 1000 to $2 \times 10^5$ is preferable, a polymer having a weight-average molecular weight of from 2000 to $1 \times 10^5$ is more preferable, and a polymer having a weight-average molecular weight of from 5000 to $5 \times 10^4$ is particularly preferable as the binder.

The content amount of the alkali-soluble binder with respect to the total solid content (mass) of the dye-containing negative curable composition of the present invention is preferably 10 to 90 mass %, more preferably 20 to 80 mass %, and particularly preferably 30 to 70 mass %.

Cross-Linking Agent

In the present invention, a cross-linking agent may be used to obtain a more highly cured film. The cross-linking agent that may be used in the present invention is not particularly limited as long as it can cure a film by means of cross-linking reaction, and examples thereof include (a) an epoxy resin, (b) a melamine compound, guanamine compound, glycoluril compound or urea compound substituted by at least one selected from a methylol group, an alkoxymethyl group and an acyloxymethyl group, and (c) a phenol compound, naphthol compound, or hydroxyanthracene compound substituted by at least one selected from a methylol group, an alkoxymethyl group and an acyloxymethyl group. Among these, a polyfunctional epoxy resin is particularly preferable.

The above (a) epoxy resin may be any epoxy resin as long as it has an epoxy group and a cross-linking property. Examples thereof include: bivalent glycigyl group-containing low-molecular compounds such as bisphenol A diglycidyl ether, ethylene glycol diglycidyl ether, butanediol diglycidyl ether, hexanediol diglycidyl ether, dihydroxy biphenyl diglycidyl ether, phthalic acid diglycidyl ester or N,N-diglycidyl aniline; trivalent glycidyl group-containing low-molecular compounds represented by trimethylol propane triglycidyl ether, trimethylol phenol triglycidyl ether, TrisP-PA triglycidyl ether or the like; quadrivalent glycidyl group-containing low-molecular compounds represented by pentaerythritol tetraglycidyl ether, tetramethylol bisphenol A tetraglycidyl ether, or the like; polyvalent glycidyl group-containing low-molecular compounds such as dipentaerythritol pentaglycidyl ether, or dipentaerythritol hexaglycidyl ether; and glycidyl group-containing high-molecular compounds represented by polyglycidyl(meth)acrylate, 1,2-epoxy-4-(2-oxylanyl)cyclohexane added with 2,2-bis(hydroxymethyl)-1-butanol, or the like.

The number of sites substituted by a methylol group, alkoxymethyl group or acyloxymethyl group in the above cross-linking agent (b) is preferably from 2 to 6 in a melamine compound and from 2 to 4 in a glycoluril compound, guanamine compound or urea compound, and is more preferably from 5 to 6 in a melamine compound and from 3 to 4 in a glycoluril compound, guanamine compound or urea compound.

In the following, the melamine compound, guanamine compound, glycoluril compound and urea compound of (b) above are collectively referred to as the compound according to (b) (a compound containing a methylol group, alkoxymethyl group or acyloxymethyl group).

The compound containing a methylol group according to (b) can be obtained by heating the compound containing an alkoxymethyl group according to (b) in alcohol in the presence of an acid catalyst such as hydrochloric acid, sulfuric acid, nitric acid or methanesulphonic acid. The compound containing an acyloxymethyl group according to (b) can be obtained by mixing the compound containing a methylol group according to (b) with acyl chloride by stirring in the presence of a basic catalyst.

Specific examples of the above compound having a substituent group according to (b) are given in the following.

Examples of the melamine compound include hexamethylol melamine, hexamethoxymethyl melamine, a compound in which 1 to 5 methylol groups in hexamethylol melamine have been methoxymethylated and mixtures thereof, hexmethoxyethyl melamine, hexaacyloxymethyl melamine, a compound in which 1 to 5 methylol groups in hexamethylol melamine have been acyloxymethylated and mixtures thereof.

Examples of the guanamine compound include tetramethylol guanamine, tetramethoxy methyl guanamine, a compound in which 1 to 3 methylol groups in tetramethylol guanamine have been methoxymethylated, mixtures thereof, tetrakmethoxy ethyl guanamine, tetraacyloxy methyl guanamine, a compound in which 1 to 3 methylol groups in tetramethylol guanamine have been acyloxymethylated, and mixtures thereof.

Examples of the glycoluryl compound include tetramethylol glycoluryl, tetramethoxy methyl glycoluryl, a compound in which 1 to 3 methylol groups in tetramethylol glycoluryl have been methoxymethylated, mixtures thereof, a compound in which 1 to 3 methylol groups in tetramethylol glycoluryl have been acyloxymethylated, and mixtures thereof.

Examples of the urea compound include tetramethylol urea, tetramethoxy methyl urea, a compound in which 1 to 3 methylol groups in tetramethylol urea have been methoxymethylated, mixtures thereof, and tetramethoxy ethyl urea.

These compounds according to (b) may be used singly or in combination.

The above cross-linking agent (c), that is, the phenol compound, naphthol compound or hydroxyanthracene compound substituted by at least one selected from a methylol group, an alkoxymethyl group and an acyloxymethyl group, suppresses intermixing of a film with an overcoated photoresist, and also further increases the strength of the film, as a result of heat cross-linking, similarly to the above cross-linking agent (b). In the following, these compounds are collectively referred to as the compound (a compound containing a methylol group, alkoxymethyl group or acyloxymethyl group) according to (c).

The number of methylol groups, alkoxymethyl groups and acyloxymethyl groups included in the above cross-linking agent (c) needs to be at least two per molecule, and when a phenol compound forms the skeleton, a compound having both second and fourth positions substituted by these substituents is preferable in view of heat crosslinkability and storage stability.

Further, when a naphthol compound or hydroxyanthracene compound forms the skeleton, a compound having all ortho and para positions with respect to the OH group substituted by these substituents is preferable. In the phenol compound, the third and fifth positions either may not be substituted or may have a substituent.

In the naphthol compound, positions other than the ortho positions with respect to the OH group either may not be substituted or may have a substituent.

The compound containing a methylol group according to (c) can be obtained by using as a precursor a compound in which the second or fourth position with respect to the phenolic OH group is a hydrogen atom, and reacting this with formalin in the presence of a basic catalyst such as sodium hydroxide, potassium hydroxide, ammonia or tetra-alkyl ammonium hydroxide.

The compound containing an alkoxymethyl group according to (c) can be obtained by heating the compound containing a methylol group according to (c) in the presence of an acid catalyst such as hydrochloric acid, sulfuric acid, nitric acid or methanesulphonic acid.

The compound containing an acyloxymethyl group according to (c) can be obtained by reacting the compound containing a methylol group according to (c) with acyl chloride in the presence of a basic catalyst.

Examples of the skeleton compound in the cross-linking agent (c) include a phenol, naphthol, or an hydroxyanthracene compound having either the ortho position or the para position with respect to the phenolic OH group not substituted and, for example, isomers of phenol or cresol, 2,3-xylenol, 2,5-xylenol, 3,4-xylenol, 3,5-xylenol, bisphenols such as bisphenol A, 4,4'-bishydroxybiphenyl, TrisP-PA (manufactured by Honshu Chemical Industry Co., Ltd.), naphthol, dihydroxynaphthalene, 2,7-dihydroxyanthracene or the like, may be used.

Specific examples of the cross-linking agent (c) include, as the phenol compound or the naphthol compound, trimethylol phenol, tri(methoxymethyl)phenol, a compound in which 1 or 2 methylol groups in trimethylol phenol have been methoxymethylated, trimethylol-3-cresol, tri(methoxymethyl)-3-cresol, a compound in which 1 or 2 methylol groups in trimethylol-3-cresol have been methoxymethylated, dimethylol cresols such as 2,6-dimethylol-4-cresol, tetramethylol bisphenol A, tetra(methoxymethyl)bisphenol A, a compound in which 1 to 3 methylol groups in tetramethylol bisphenol A have been methoxymethylated, tetramethylol-4,4'-dihydroxybiphenyl, tetramethoxymethyl-4,4'-dihydroxybiphenyl, hexamethylol derivatives of TrisP-PA, hexamethoxymethyl derivatives of TrisP-PA, a compound in which 1 to 5 methylol groups in a hexamethylol derivatives of TrisP-PA have been methoxymethylated, and bishydroxymethyl naphthalene diol.

Further, examples of the hydroxyanthracene compound include 1,6-di(hydroxymethyl)-2,7-dihydroxyanthracene, and examples of the compound containing an acyloxymethyl group include a compound in which either some or all of the methylol groups in the above compound containing a methylol group have been acyloxymethylated.

Preferable examples of these compounds include trimethylol phenol, bishydroxymethyl-p-cresol, tetramethylol bisphenol A, hexamethylol derivatives of TrisP-PA (manufactured by Honshu Chemical Industry Co., Ltd.), and phenol compounds in which all or some of the methylol groups in any of these compounds are substituted by alkoxymethyl groups.

These compounds according to (c) may be used either singly or in combination thereof.

The content amount of the cross-linking agent with respect to the total solid content (mass) of the dye-containing negative curable composition of the present invention differs according to the material, but is preferably 1 to 70 mass %, more preferably 5 to 50 mass % and particularly preferably 7 to 30 mass %.

Thermal Polymerization Inhibitor

The dye-containing negative curable composition of the present invention may include a thermal polymerization inhibitor, examples of which include hydroquinone, p-methoxy phenol, di-t-butyl-p-cresol, pyrogallol, t-butyl cathecol, benzoquinone, 4,4'-thiobis(3-methyl-6-t-butylphenol), 2,2'-methylenebis(4-methyl-6-t-butylphenol) and 2-mercapto benzoimidazole.

Organic Solvent

As mentioned in the foregoing, the dye-containing negative curable composition of the present invention includes cyclopentanone as an organic solvent.

The dye-containing negative curable compound of the present invention may include other organic solvent than cyclopentanone. These organic solvents are not particularly limited as long as the solubility of respective components and the coating properties of the negative curable composition are satisfied, but may be preferably selected after consideration of the ability of dissolving the dye and binder, coating properties and safety.

Preferable examples of the organic solvent other than cyclopentanone include esters such as ethyl acetate, n-butyl acetate, isobutyl acetate, amyl formate, isoamyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, alkyl 3-oxypropionates such as methyl 3-oxypropionate and ethyl 3-oxypropionate, including methyl 3-methoxypropionate, ethyl 3-methoxypropionate, methyl 3-ethoxypropionate, ethyl 3-ethoxypropionate, and the like; alkyl 2-oxypropionates such as methyl 2-oxypropionate, ethyl 2-oxypropionate and propyl 2-oxypropionate, including methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, and the like; methyl pyruvate, ethyl pyruvate, propyl pyruvate, methyl acetoacetate, ethyl acetoacetate, methyl 2-oxobutanate, ethyl 2-oxobutanate, ethers such as diethylene glycol dimethyl ether, tetrahydrofuran, ethylene glycol monomethyl ether, ethylene glycol monoethyl ether, methyl cellosolve acetate, ethyl cello solve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, ketones such as methyl ethyl ketone, cyclohexanone, 2-heptanone, 3-heptanone, and the like; and aromatic hydrocarbons such as toluene, xylene and the like.

Among these, organic solvents having a hydroxyl group such as methyl lactate, ethyl lactate, propylene glycol monomethyl ether and propylene glycol monoethyl ether, and organic solvents having no hydroxyl group, such as those having a ketone group including methyl ethyl ketone, cyclohexanone, 2-heptanone, propylene glycol monomethyl ether acetate, and the like are preferable. Methyl ethyl ketone, cyclohexanone and 2-heptanone are particularly preferable.

The major characteristic of the present invention is that cyclopentanone is used as an alternative solvent for cyclohexanone. However, it is also effective to use cyclopentatnone in combination with cyclohexanone at the same time.

When the dye-containing negative curable composition of the present invention includes other solvent than cyclopentatnone, the content of cyclopentanone in the total amount of the organic solvent is preferably 5 to 95 mass %, more preferably 20 to 80 mass %, and particularly preferably 40 to 60 mass %.

Other Additives

Various additives such as fillers, high-molecular compounds other than the aforementioned alkali-soluble binders, surfactants, adhesion promoters, antioxidants, ultraviolet absorbers, and anticoagulants may be incorporated into the dye-containing negative curable composition of the present invention as necessary.

Specific examples of the above additives include fillers such as glass and alumina; high-molecular compounds other than the aforementioned binders, such as polyvinyl alcohol, polyacrylic acid, polyethylene glycol monoalkyl ether and polyfluoroalkyl acrylate; nonionic, cationic and anionic surfactants, and the like; adhesion promoters such as vinyl trimethoxysilane, vinyl triethoxysilane, vinyl tris(2-methoxyethoxy)silane, N-(2-aminoethyl)-3-aminopropyl methyl dimethoxysilane, N-(2-aminoethyl)-3-aminopropyl trimethoxysilane, 3-aminopropyl triethoxysilane, 3-glycidoxypropyl trimethoxysilane, 3-glycidoxypropyl methyl dimethoxysilane, 2-(3,4-epoxycyclohexyl)ethyl trimethoxysilane, 3-chloropropyl methyl dimethoxysilane, 3-chloropropyl trimethoxysilane, 3-methacryloxypropyl trimethoxysilane and 3-mercaptopropyl trimethoxysilane; antioxidants such as 2,2-thiobis(4-methyl-6-t-butylphenol) and 2,6-di-t-butyl phenol; ultraviolet absorbers such as 2-(3-t-butyl-5-methyl-2-hydroxyphenyl)-5-chlorobenzotriazole and alkoxybenzophenone; and anticoagulants such as sodium polyacrylate.

Further, an organic carboxylic acid, preferably having a low-molecular weight of 1000 or less, can be added to the dye-containing negative curable composition of the present invention in order to promote the alkali solubility of the non-exposed portion and further improve the developability of the composition.

Specific examples of the organic carboxylic acid include aliphatic monocarboxylic acids such as formic acid, acetic acid, propionic acid, butyric acid, valeric acid, pivalic acid, caproic acid, diethyl acetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; aliphatic tricarboxylic acids such as tricarballylic acid, aconitic acid and camphoronic acid; aromatic monocarboxylic acids such as benzoic acid, toluic acid, cuminic acid, hemellitic acid and mesitylenic acid; aromatic polycarboxylic acids such as phthalic acid, isophthalic acid, terephthalic acid, trimellitic acid, trimesic acid, mellophanic acid and pyromellitic acid; and other carboxylic acids such as phenyl acetic acid, hydratropic acid, hydrocinnamic acid, mandelic acid, phenylsuccinic acid, atropic acid, cinnamic acid, cinnamylidene acetic acid, coumaric acid, and umbellic acid.

In the dye-containing negative curable composition of the present invention, the mass ratio of the solid content of photopolymerizable compound and the solid content of alkali-soluble binder (photopolymerizable compound/alkali-soluble binder) is preferably 5 or more, more preferably 10 or more, and particularly preferably 100 or more.

Further, a system in which no alkali-soluble binder is used is also preferable.

Color Filter and Method of Production Thereof

Next, the color filter of the present invention is described in detail by means of a description of the method of production thereof.

The dye-containing negative curable composition of the present invention described in the foregoing is used in the method of producing a color filter of the present invention.

The method of producing a color filter of the present invention includes forming a radioactive composition layer by applying the dye-containing negative curable composition onto a substrate by a coating method such as spin coating, flow coating or roll coating; exposing the formed layer via a given mask pattern; and developing the exposed layer with a developer to form a negative color pattern (image formation process). As necessary, the method may include a process of curing the formed color pattern by heating and/or exposing to light.

In the production of a color filter, a color filter composed of intended hues can be produced by repeating the above image formation process (and, as necessary, the curing process) for the number of times corresponding to the number of intended hues. Ultraviolet rays such as g-line, h-line and i-line are preferably used as the light or radiation rays.

Examples of the material for the substrate include soda glass, borosilicate glass (such as Pyrex (registered trademark) glass), silica glass and those with a transparent conductive film formed thereon, which are used in liquid crystal display elements and the like; photoelectrical conversion element substrates used in image sensors and the like, such as a silicon substrate; and complementary metal oxide film semiconductors (CMOS). In certain cases, these substrates may be formed with black stripes separating respective pixels.

Further, an undercoating layer may be provided on these substrates, as necessary, for the purpose of improving adhesiveness with the upper layer, preventing diffusion of materials, planarizing the substrate surface, and the like.

In the present invention, the substrate is preferably photoelectrical conversion element substrates used in image sensors and the like, such as a silicon substrate, or complementary metal oxide film semiconductors (CMOS).

Any developer may be used as long as it dissolves an uncured portion of the negative curable composition of the present invention but does not dissolve an irradiated portion of the layer formed from the dye-containing negative curable composition of the present invention. Specifically, combinations of various organic solvents or alkaline aqueous solutions may be used. Examples of the organic solvents include the organic solvents described above that are used in preparing the dye-containing negative curable composition of the present invention.

Favorable examples of the alkaline aqueous solution include alkaline aqueous solutions formed by dissolving an alkaline compound such as sodium hydroxide, potassium hydroxide, sodium carbonate, sodium silicate, sodium metasilicate, ammonia water, ethylamine, diethylamine, dimethyl ethanol amine, tetramethyl ammonium hydroxide, tetraethyl ammonium hydroxide, choline, pyrrole, piperidine and 1,8-diazabicyclo-[5.4.0]-7-undecene, to a density of from 0.001 to 10 mass %, preferably from 0.01 to 1 mass %. In addition, when the developer includes this kind of alkaline aqueous solution, washing with water is generally performed after development.

The color filter of the present invention can be used in liquid crystal display elements and solid state image sensors such as CCDs and, in particular, is favorably used CCDs, CMOSs and the like with high-resolution of more than one million pixels. The color filter of the present invention can be used, for example, as a color filter disposed between the light receiving portion of respective pixels configuring a CCD and a microlens for focusing light.

The thickness of a color pattern (color pixel) in the color filter used in a solid-state image sensor is preferably 2.0 µm or less and more preferably 1.0 µm or less. The size of the color pattern (color pixel), or the pattern width, is preferably 2.5 µm or less, more preferably 2.0 µm or less, and particularly preferably 1.7 µm or less.

The following are exemplary embodiments of the present invention.

<1> A dye-containing negative curable composition comprising: a dye that is soluble in an organic solvent, a photopolymerization initiator, a photopolymerizable compound, and cyclopentanone.

<2> The dye-containing negative curable composition according to <1>, further comprising an organic solvent other than cyclopentanone.

<3> The dye-containing negative curable composition according to <2>, wherein the organic solvent comprises cyclohexanone.

<4> The dye-containing negative curable composition according to <2>, wherein the organic solvent comprises propylene glycol monomethyl ether acetate.

<5> A color filter formed from the dye-containing negative curable composition according to <1>.

<6> A color filter formed from the dye-containing negative curable composition according to <2>.

<7> A color filter formed from the dye-containing negative curable composition according to <3>.

<8> A color filter formed from the dye-containing negative curable composition according to <4>.

<9> The color filter according to <5>, wherein the thickness of the color filter is 1 µm or less.

<10> A method of producing a color filter comprising:
applying the dye-containing negative curable composition according to <1> onto a substrate,
exposing the applied composition to light via a mask, and
developing the exposed composition to form a pattern.

EXAMPLES

In the following, the present invention is explained in further detail using examples; however, the present invention is not limited to the following examples as long as it does not exceed the main essence of the invention. In addition, unless otherwise indicated, "parts" and "percent" refer to the mass standard.

Examples 1 to 9 and Comparative Examples 1 to 3

1) Preparation of Dye-Containing Negative Curable Composition

The compounds shown in the following Table 1 were mixed and dissolved to prepare the dye-containing negative curable composition of the present invention.

TABLE 1

|  | Organic solvent (parts) | Alkali-soluble binder (parts) | Photo-polymerizable compound (parts) | Photopoly-merization initiator (parts) | Dye soluble in organic solvent (parts) | Surfactant (ppm) | Polymerization inhibitor (parts) |
|---|---|---|---|---|---|---|---|
| Example 1 | cyclopentanone (77.5) | Resin A (5.4) | Monomer A (8.1) | Oxime A (3.5) | Valifast yellow 1101 (3.0) | Surfactant A (100) | p-methoxyphenol (0.005) |
| Example 2 | cyclopentanone (77.5) | Resin A (4.8) | Monomer A (7.1) | Oxime A (3.1) | Valifast yellow 1101 (5.0) | Surfactant A (100) | p-methoxyphenol (0.005) |
| Example 3 | cyclopentanone (77.5) | Resin A (3.8) | Monomer A (5.7) | Oxime A (2.5) | Valifast yellow 1101 (8.0) | Surfactant A (100) | p-methoxyphenol (0.005) |
| Example 4 | cyclopentanone (77.5) | Resin A (3.2) | Monomer A (4.8) | Oxime A (2.1) | Valifast yellow 1101 (10.0) | Surfactant A (100) | p-methoxyphenol (0.005) |
| Example 5 | cyclopentanone (77.5) | Resin A (2.5) | Monomer A (3.8) | Oxime A (1.6) | Valifast yellow 1101 (12.0) | Surfactant A (100) | p-methoxyphenol (0.005) |

TABLE 1-continued

|  | Organic solvent (parts) | Alkali-soluble binder (parts) | Photo-polymerizable compound (parts) | Photopoly-merization initiator (parts) | Dye soluble in organic solvent (parts) | Surfactant (ppm) | Polymerization inhibitor (parts) |
|---|---|---|---|---|---|---|---|
| Example 6 | cyclopentanone (77.5) | Resin A (0.6) | Monomer A (6.5) | Oxime A (2.8) | Valifast yellow 1101 (10.0) | Surfactant A (100) | p-methoxyphenol (0.005) |
| Example 7 | cyclopentanone (77.5) | — | Monomer A (6.9) | Oxime A (3.0) | Valifast yellow 1101 (10.0) | Surfactant A (100) | p-methoxyphenol (0.005) |
| Example 8 | cyclopentanone/ cyclohexanone (1/1) (77.5) | Resin A (0.6) | Monomer A (6.5) | Oxime A (2.8) | Valifast yellow 1101 (10.0) | Surfactant A (100) | p-methoxyphenol (0.005) |
| Example 9 | cyclopentanone/ propylene glycol monomethyl ether acetate (1/1) (77.5) | Resin A (0.6) | Monomer A (6.5) | Oxime A (2.8) | Valifast yellow 1101 (10.0) | Surfactant A (100) | p-methoxyphenol (0.005) |
| Comparative Example 1 | cyclohexanone (77.5) | Resin A (0.6) | Monomer A (6.5) | Oxime A (2.8) | Valifast yellow 1101 (10.0) | Surfactant A (100) | p-methoxyphenol (0.005) |
| Comparative Example 2 | propylene glycol monomethyl ether acetate (77.5) | Resin A (0.6) | Monomer A (6.5) | Oxime A (2.8) | Valifast yellow 1101 (10.0) | Surfactant A (100) | p-methoxyphenol (0.005) |
| Comparative Example 3 | cyclohexanone/ propylene glycol monomethyl ether acetate (1/1) (77.5) | Resin A (0.6) | Monomer A (6.5) | Oxime A (2.8) | Valifast yellow 1101 (10.0) | Surfactant A (100) | p-methoxyphenol (0.005) |

In Table 1, "Resin A" refers to a copolymer of benzyl methacrylate and methacrylic acid (at a weight ratio of 80/20), "Monomer A" refers to dipentaerythritol hexaacrylate (DPHA, manufactured by Nippon Kayaku Co., Ltd.), "Oxime A" refers to (2-(O-benzoyloxime)-1-[4-(phenylthio) phenyl]-1,2-octanedione (OXE-01, manufactured by Ciba Japan, K.K.), and "Surfactant A" refers to a copolymer of an acrylate having a $C_6F_{13}$ group, (poly(oxypropylene))acrylate and (poly(oxypropylene))methacrylate.

2) Production of Silicon Wafer Substrate with Undercoat Layer

A resist solution (product name: CT-4000L; manufactured by FUJIFILM Electronic Materials Co., Ltd.) was applied onto a silicon wafer substrate to a thickness of 0.1 µm using a spincoater, and dried by heating at 220° C. for three minutes by a hot plate to form a cured film (undercoat layer).

3) Exposure and development of dye-containing negative curable composition (image formation process)

The dye-containing negative curable composition obtained in 1) above was applied onto the undercoat layer formed on the silicon substrate obtained in 2) above to a film thickness of 0.8 µm using a spincoater, and prebaked at 100° C. for 120 seconds.

Subsequently, exposure was performed using an i-line reduced projection exposure apparatus (product name: FPA-3000i5+; manufactured by Canon Inc.) at a wavelength of 365 nm via a 2 µm-mask, at different exposure amounts.

After the exposure, development was performed using a developer (product name: CD-2060; manufactured by FUJIFILM Electronic Materials Co., Ltd.) at 23° C. for 60 seconds, followed by rinsing with running water for 20 seconds and spray-drying to form a pattern image. The obtained pattern image was observed according to a normal method using an optical microscope and SEM photography.

In the foregoing, the 2 µm-mask refers to a mask having a mask pattern in which plural patterns of 2 µm-square size are positioned at an interval of 2 µm (i.e., the distance between the edges of adjacent square patterns is 2 µm). In the following, the interval (distance) between the square patterns may be simply referred to as a "space".

4) Evaluation

Evaluation of the Examples 1 to 9 and Comparative Examples 1 to 3 was conducted in accordance with the following method. The results are shown in Table 2.

(1) Sensitivity

The exposure amount at which the ratio of the pattern width to the space (pattern width: space) is 1:1 in the formed image is determined as an index of sensitivity. The value of the exposure amount is preferably lower since the sensitivity is higher.

(2) In-Plane Uniformity

In-plane thickness of the film formed by using a spin coater was measured using a stylus-type film thickness meter (product name: DEKTAK 6M; manufactured by Veeco Instruments) at 10 positions, and the difference between the maximum thickness and the minimum thickness was calculated. The difference is preferably smaller since the coating is more uniform.

TABLE 2

|  | Sensitivity (mJ/cm$^2$) | In-plane uniformity (µm) |
|---|---|---|
| Example 1 | 300 | 0.02 |
| Example 2 | 320 | 0.02 |
| Example 3 | 400 | 0.02 |
| Example 4 | 500 | 0.02 |
| Example 5 | 600 | 0.02 |
| Example 6 | 400 | 0.01 |
| Example 7 | 300 | 0.01 |
| Example 8 | 400 | 0.01 |
| Example 9 | 350 | 0.01 |
| Comparative Example 1 | 500 | 0.06 |
| Comparative Example 2 | 500 | 0.08 |
| Comparative Example 3 | 500 | 0.08 |

As shown in Table 2, Examples 1 to 9 exhibit a high degree of in-plane uniformity (coating uniformity) as compared with Comparative Examples 1 to 3.

In Examples 1 to 9, dye-containing negative curable compositions were prepared from specific combinations of a dye that is soluble in an organic solvent, a photopolymerization initiator, and a photopolymerizable compound. However, similar effects may be achieved from other combinations of compounds, as long as the constitution of the present invention is satisfied.

All publications, patent applications, and technical standards mentioned in this specification are herein incorporated by reference to the same extent as is each individual publication, patent application, or technical standard was specifically and individually indicated to be incorporated by reference.

What is claimed is:

1. A dye-containing negative curable composition comprising:
   a dye and an organic solvent, the dye being soluble in the organic solvent,
   a photopolymerization initiator, and a photopolymerizable compound, wherein
   the organic solvent comprises a combination of cyclopentanone and propylene glycol monomethyl ether acetate, wherein
   the photopolymerization initiator comprises 2-(O-benzoyloxime)-1-[4-(phenylthio)phenyl]-1,2-octanedione, and wherein
   a content of cyclopentanone in the total amount of the organic solvent is from 40 to 60 mass %.

2. A color filter formed from the dye-containing negative curable composition according to claim 1.

3. The color filter according to claim 2, wherein the thickness of the color filter is 1 μm or less.

4. A method of producing a color filter comprising:
   applying the dye-containing negative curable composition according to claim 1 onto a substrate,
   exposing the applied composition to light via a mask, and
   developing the exposed composition to form a pattern.

* * * * *